(12) United States Patent
O'Neill (10) Patent No.: US 12,107,183 B2
(45) Date of Patent: Oct. 1, 2024

(54) SHORT-WAVE INFRA-RED RADIATION DETECTION DEVICE

(71) Applicant: PixQuanta Limited, Cork (IE)

(72) Inventor: Kevin O'Neill, Blackrock (IE)

(73) Assignee: PixQuanta Limited, Cork (IE)

( * ) Notice: Subject to any disclaimer, the term of this patent is extended or adjusted under 35 U.S.C. 154(b) by 129 days.

(21) Appl. No.: 17/672,035

(22) Filed: Feb. 15, 2022

(65) Prior Publication Data

US 2022/0344529 A1 Oct. 27, 2022

(30) Foreign Application Priority Data

Apr. 23, 2021 (EP) .................................. 21170197

(51) Int. Cl.
   *H01L 31/109* (2006.01)
   *H01L 27/146* (2006.01)
   *H01L 31/0232* (2014.01)

(52) U.S. Cl.
   CPC ...... *H01L 31/109* (2013.01); *H01L 27/14634* (2013.01); *H01L 31/02327* (2013.01)

(58) Field of Classification Search
   CPC ............. H01L 31/109; H01L 31/02327; H01L 31/03685; H01L 31/1055; H01L 31/108; H01L 27/14634; H01L 27/1465; H01L 27/14669; G01J 5/022; G01J 5/024; G01J 2005/0077
   See application file for complete search history.

(56) References Cited

U.S. PATENT DOCUMENTS

| | | | |
|---|---|---|---|
| 2001/0000335 A1* | 4/2001 | Yamada ................. | H01L 33/26 438/1 |
| 2004/0037542 A1* | 2/2004 | Kanishi .................. | H05B 3/009 392/407 |
| 2004/0135209 A1* | 7/2004 | Hsieh ..................... | H01L 31/109 257/E27.132 |

(Continued)

OTHER PUBLICATIONS

Casalino, M. et al., "Silicon resonant cavity enhanced photodetector based on the internal photoemission effect at 1.55nm: Fabrication and characterization," Applied Physics Letters, AIP Publishing, Jun. 24, 2008, 92, 251104, 4 pages.

(Continued)

*Primary Examiner* — Sitaramarao S Yechuri (74) *Attorney, Agent, or Firm* — Withrow & Terranova, P.L.L.C.

(57) ABSTRACT

A short-wave infra-red, SWIR, radiation detection device comprises: a first metallic layer providing a first set of connections from a readout circuit to respective cells of a matrix, the metallic layer reflecting SWIR wavelength radiation. Each matrix cell comprises at least one stack of layers including: a first layer of doped semiconductor material formed on the first metallic layer; an at least partially microcrystalline semiconductor layer formed over the first doped layer; a second layer of semiconductor material formed on the microcrystalline semiconductor layer; at least one microcrystalline semiconductor layer; and in some embodiments a second metallic layer interfacing the microcrystalline semiconductor layer(s), the interface being responsive to incident SWIR radiation to generate carriers within the stack. The stack has a thickness $T=\lambda/2N$ between reflective surfaces of the first and second metallic layers.

13 Claims, 8 Drawing Sheets

(56) References Cited

U.S. PATENT DOCUMENTS

| | | | | |
|---|---|---|---|---|
| 2005/0229965 | A1* | 10/2005 | Nishimura | H01L 31/075 |
| | | | | 136/255 |
| 2006/0039666 | A1* | 2/2006 | Knights | H01L 31/105 |
| | | | | 385/39 |
| 2008/0096291 | A1* | 4/2008 | Takai | H01L 21/67253 |
| | | | | 257/E21.001 |
| 2010/0304526 | A1* | 12/2010 | Psyk | H01L 31/046 |
| | | | | 257/E31.113 |
| 2011/0000521 | A1* | 1/2011 | Tachibana | H01L 31/046 |
| | | | | 257/E21.531 |
| 2013/0092211 | A1* | 4/2013 | Collin | G02B 5/003 |
| | | | | 136/246 |
| 2019/0146100 | A1* | 5/2019 | O'Neill | H01L 31/03762 |
| | | | | 250/370.11 |

OTHER PUBLICATIONS

Desiatov, B. et al., "Plasmonic enhanced silicon pyramids for internal photoemission Schottky detectors in the near-infrared regime," Optica, Apr. 1, 2015, 4 pages.

Peters, D. W., "An Infrared Detector Utilizing Internal Photoemission", Proceedings of the IEEE, Institute of Electrical and Electronics Engineers (IEEE), May 1967, pp. 704-705.

European Search Report for EP 21170197.4, mailed Sep. 24, 2021, 8 pages.

Examination Report for European Patent Application No. 21170197.4, mailed Jun. 7, 2023, 5 pages.

Summons to Attend Oral Proceedings for European Patent Application No. 21170197.4, mailed Oct. 10, 2023, 5 pages.

\* cited by examiner

SHORT-WAVE INFRA-RED RADIATION DETECTION DEVICE

RELATED APPLICATIONS

This application claims priority to European Patent Application No. 21170197.4, filed Apr. 23, 2021, the disclosure of which is incorporated herein by reference in its entirety.

FIELD OF THE DISCLOSURE

The present invention relates to a short-wave infra-red (SWIR) radiation detection device.

BACKGROUND

The principal of internal photoemission is known for some time: Peters, D. W., "An Infrared Detector Utilizing Internal Photoemission", Proceedings of the IEEE, Institute of Electrical and Electronics Engineers (IEEE), 1967, 55, 704-705 discloses a metal-semiconductor contact with photoemission taking place over the Schottky barrier. This simple approach however suffers from limited efficiency.

Unlike Mid-Wave Infrared (MWIR) and Long-Wave Infrared (LWIR) light, which is emitted from the object itself, Short-Wave Infra-Red (SWIR) is similar to visible light in that photons are reflected or absorbed by an object, providing a strong contrast beneficial for high resolution imaging. SWIR imaging is therefore used in a variety of applications including electronic board inspection, solar cell inspection, produce inspection, identifying and sorting, surveillance, anti-counterfeiting, process quality control. Ambient star light and background radiance (nightglow) are also natural emitters of SWIR and provide excellent illumination for outdoor, night-time imaging.

Since silicon sensors have an upper limit of approximately 1.0 µm, SWIR imaging requires alternative optical and electronic components and materials.

Casalino, M.; Sirleto, L.; Moretti, L.; Gioffrè, M.; Coppola, G. & Rendina, I., "Silicon resonant cavity enhanced photodetector based on the internal photoemission effect at 1.55 µm: Fabrication and characterization", Applied Physics Letters, AIP Publishing, 2008, 92, 251104 discloses a resonant cavity including a bottom buried reflector and a top metal mirror surrounding a silicon layer with a thickness of $\lambda/2$, where $\lambda$ is the wavelength of light being sensed.

Indium gallium arsenide (InGaAs) sensors are used in SWIR imaging. However, while linear line-scan InGaAs sensors are commercially available, area-scan InGaAs sensors are restricted products.

An example of an area sensor primarily concerned with improving sensitivity to X-ray radiation is disclosed in US 2019/146100. Here a device comprises a detector matrix with a plurality of N rows divided into a plurality of M columns of cells, each cell comprising a plurality of diode segments formed in a sensor stack and responsive to electromagnetic radiation incident on the device. The sensor stack is fabricated on a ReadOut Integrated Circuit (ROIC) including a scan driver which provides a plurality of N scan line signals to respective rows of the matrix, each for enabling values from cells of a selected row of the matrix to be read. A reader reads a plurality of M signals from respective columns of the matrix, each corresponding to a cell within a selected row of the matrix. Each diode segment is connected to a drive voltage sufficient to operate each diode segment in avalanche multiplication Geiger mode; and connected in series with an avalanche quenching resistor to the reader.

All references listed in this section are incorporated herein by reference in their entireties.

SUMMARY

In a first aspect, there is provided a short-wave infra-red (SWIR) radiation detection device according to claim 1.

In a second aspect, there is provided a short-wave infra-red (SWIR) radiation detection device according to claim 5.

Embodiments of the invention provide a SWIR detector array formed on an CMOS process fabricated ROIC.

A micro-crystalline silicon layer (µc-Si) employed in the sensor stack of the embodiments can be formed using a plasma-enhanced chemical vapor deposition (PECVD) process compatible with the underlying CMOS circuitry.

BRIEF DESCRIPTION OF THE DRAWING FIGURES

Embodiments of the invention will now be described, by way of example, with reference to the accompanying drawings, in which.

DETAILED DESCRIPTION

Figure 1:
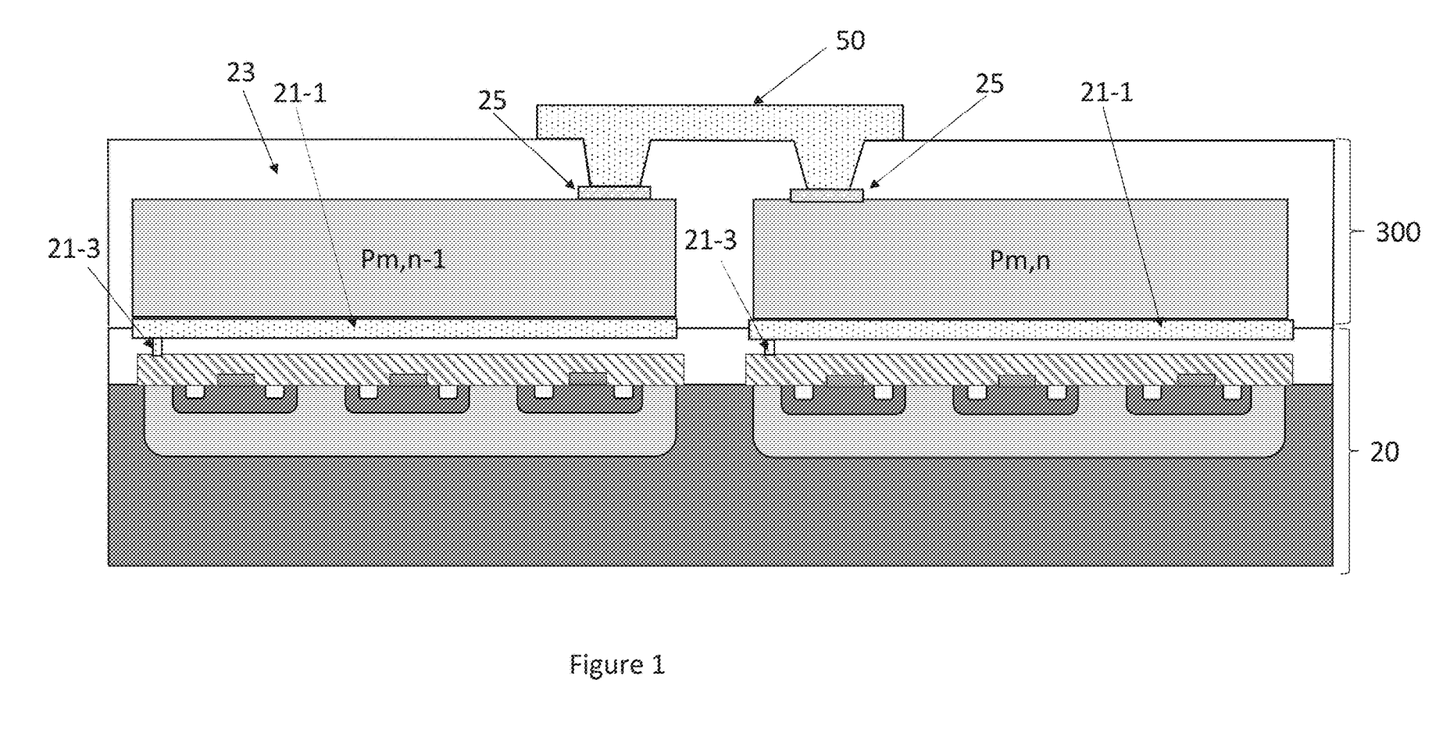
FIG. 1 is a cross-section of a portion of an SWIR detector according to embodiments of the present invention.
Figure 2:
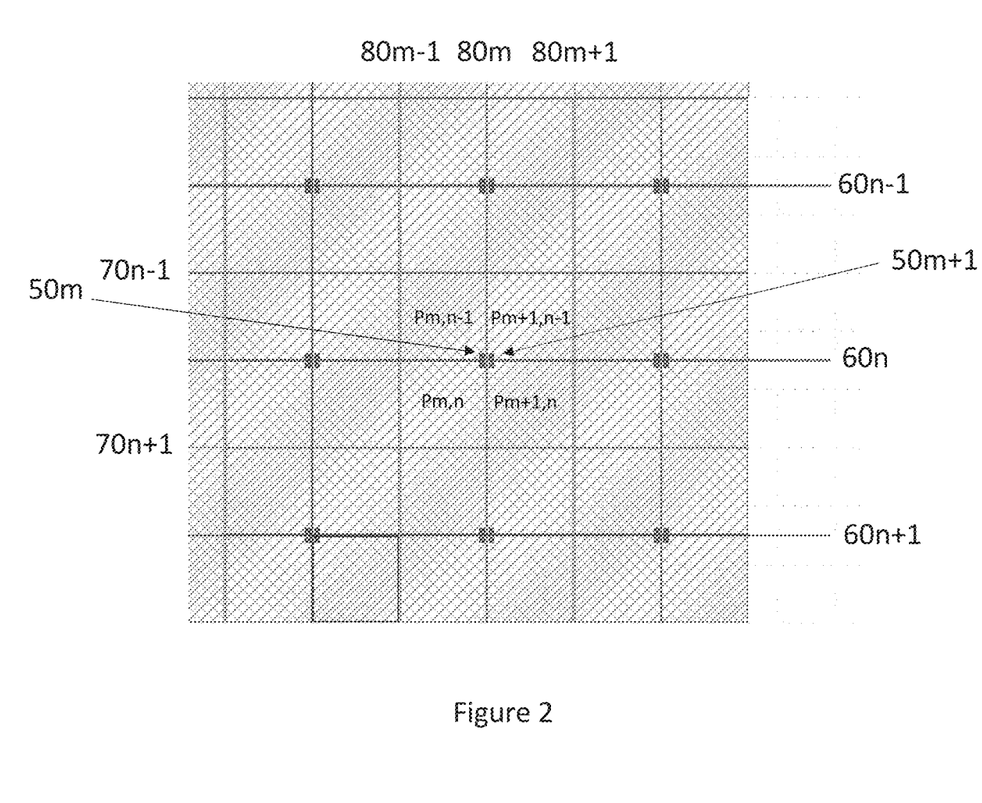
FIG. 2 is a plan view of a portion of the SWIR detector of FIG. 1.

Referring now to FIGS. 1 and 2, embodiments of the present invention relate to an area scan SWIR detector. The detector comprises read-out circuitry (ROIC) 20 similar to that described US 2019/146100 (incorporated herein by reference) and fabricated using CMOS processing.

A sensor stack 300 is formed on the ROIC 20 in accordance with a number of different embodiments of the invention which will be described in more detail below. The sensor stack 300 comprises an array of M×N pixels Pm,n separated from one another by a dielectric material 23. A bottom layer 21-1 of the sensor stack 300 comprises an aluminum or indeed any suitable metallic or conductive material layer which comprises traces interconnecting with row 70 and column 80 address lines, FIG. 2, of the ROIC 20 through vias 21-3.

In the embodiment, individual pixels on adjacent rows (n−1, n) can be interconnected through conductive bridges 50 formed on the top surfaces of the dielectric material 23 separating the individual pixels with conductive vias extending through the dielectric material to make contact with respective metallic pads 25 comprising the top layer of each sensor pixel Pm,n−1, Pm,n. Adjacent pairs of pixels joined to one another with respective bridges 50m, 50m+1, can connect through traces 60 (not shown in FIG. 1) to a cathode biassing signal provided by the ROIC circuitry so that four pixels can be ganged to one biassing bus connection. (In other embodiments, the biassing signal could comprise an anode biassing signal.) Note that in FIG. 2, row address line 70n is not shown as it is formed in a layer below biassing line 60n.

The dielectric layer 23 can cover all the upper surface of the pixels and if so, it needs to be transparent to the SWIR wavelength being detected. In one embodiment, the layer 23 comprises TetraEthylOrthoSilicate (TEOS), a form of silicon oxide, typically deposited at a thickness of approximately 800 nm and then etched back to less than approximately 100 nm. The spacing between pixels can be as small as processing permits and can be approximately 130 nm. (As such, it will be appreciated that the Figures are not necessarily to scale.)

In the embodiment, pixels are approximately 75×75 µm in area, although it will be appreciated that they can be sized in accordance with resolution requirements for the detector and could be significantly smaller.

Figure 3:
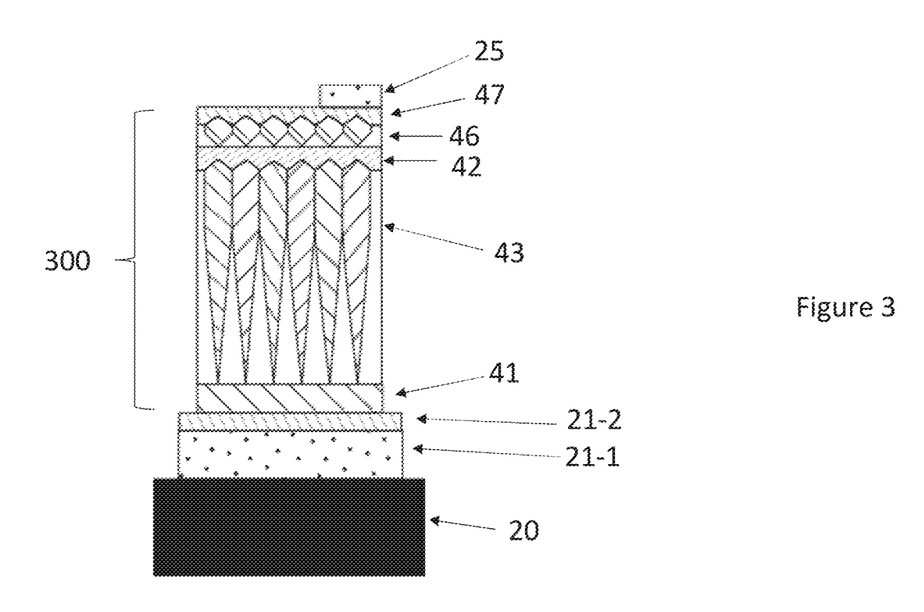
FIG. 3 is a schematic view of a stack for an SWIR detector according to a first embodiment of the present invention.

Referring to FIG. 3, there is shown a first embodiment of a sensor stack 300 for use within the detector of FIGS. 1 and 2. In the embodiment, a further metallic layer 21-2 of Titanium Nitride TiN covers the aluminum layer 21-1. Again, other metals could be used including Indium Tin Oxide (ITO), Zirconium Nitride (ZrN) or Aluminum Nitride (AlN)—as long as their fabrication is compatible with the CMOS ROIC 20. It will also be appreciated that the term metallic is used in the present specification to refer to not alone purely metal elements or alloys, but also semi-metallic materials.

In a typical embodiment, layer 21-1 is approximately 120 nm thick, while layer 21-2 is approximately 80 nm thick. This metallic layer 21-2 reflects light in the SWIR wavelengths which has not been absorbed or converted into carriers by the upper layers of the stack 300.

In the first embodiment, the uppermost layers comprise a relatively thin metallic layer 47, in this case TiN, formed over a layer of micro crystalline silicon (µc-Si) 46. The layer of micro crystalline silicon 46 is shown as having a non-planar upper surface and this is a desirable quality in embodiments of the present application. Indeed, this characteristic can be enhanced by subjecting the surface to an anisotropic etch, for example, as described in Desiatov, B.; Goykhman, I.; Mazurski, N.; Shappir, J.; Khurgin, J. B. & Uriel, Levy, "Plasmonic enhanced silicon pyramids for internal photoemission Schottky detectors in the near-infrared regime", Optica, 2015 (incorporated herein by reference), which discloses use of KOH etching of silicon to define pyramidally shaped plasmonic concentrators to improve responsivity and signal to noise ratio.

Again, materials other than TiN such as those listed above can be used for the layer 47. At the interface of the layers 46, 47, a Schottky junction is formed and photons in the SWIR band incident on the device are converted into carriers—a process referred to as internal photoemission. A junction is formed between layer 46 and layer 21-2 comprising: a layer 42 of, for example, amorphous Silicon (α-Si); a layer 43 of mixed phase µc-Si; and a layer 41 of p-type Silicon.

It will be appreciated that semiconductor material other than Silicon can be used, for example Germanium, but in any case, these should have a normal to narrow band gap. Thus material with a bandgap less than approximately 1.1 eV are employed.

It will also be appreciated that if the polarity of the biassing signal at contact 25 were reversed, then so too would be the doping of the layer 41.

In any case, the thickness of the sensor stack is related to the wavelength of light which is to be sensed by the detector and to the refractive index of the stack material.

So, for example, for a wavelength λ of 1310 nm and silicon which has a refractive index N of 3.7 at that wavelength, the stack thickness $$T = \frac{\lambda}{2N} = 177 \text{ nm}$$

between the reflective surfaces of the layers 47 and 21-2. For germanium, the stack thickness for 1310 nm would be 149 nm. Thus, even at relatively long SWIR wavelengths of 1550 nm, stack would remain relatively thin at less than 209 nm.

Choosing such a thickness creates a resonant cavity between the interface of layers 47/46 and the surface of metallic layer 21-2, so that light reflected by the surface of the layer 21-2 may be reflected towards the layers 46/47 to amplify the internal photoemission and so increase the efficiency of the stack 300.

Figure 4:
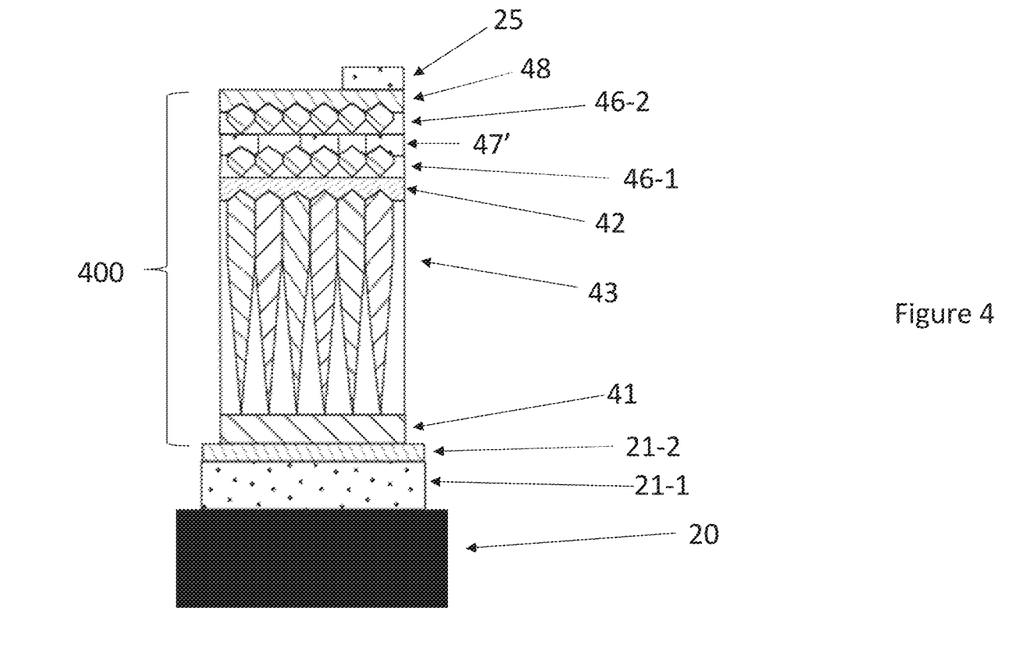
FIG. 4 is a schematic view of a stack for an SWIR detector according to a second embodiment of the present invention.

Turning now to FIG. 4 which illustrates a sensor stack 400 according to a second embodiment of the invention. Layers which are common with the sensor stack 300 of the first embodiment are provided with the same reference numerals and are not described further. In the sensor stack 400, rather than the interface between uppermost layers 46/47 of the stack 300 generating carriers in response to detected light, the stack 400 includes a patterned metallic layer 47', in this case aluminum, formed between two layers 46-1 and 46-2 of microcrystalline silicon. Again, other metallic materials such as TiN could be used. The gaps in the patterned metallic layer 47' do not need to filled with passivation material, instead the layer 46-2 can make contact with the layer 46-1 through the gaps in the layer 47'. The patterning of the layer 47' can be as a result of selective etching or treatment of a continuous grown or deposited layer, it can be as a result of the growth or deposition method itself, or for example, a nano-structuring technique can be employed to produce the pattern, so that multiple discrete metal/semiconductor interfaces are created between the layers 46-1, 46-2. In any case, the layer 47' can range in thickness typically from approximately 10 nm-100 nm.

The uppermost layer 48 of the stack 400 comprises a layer of Silicon oppositely doped to the layer 41. As such, for a cathode biassing signal, layer 48 is n-type while layer 41 is p-type silicon.

Again, internal photoemission provided by the interfaces of the layers 46-1, 47', 46-2 is amplified within the resonant cavity defined by the stack to provide efficient responsiveness to SWIR wavelengths.

Figure 5:
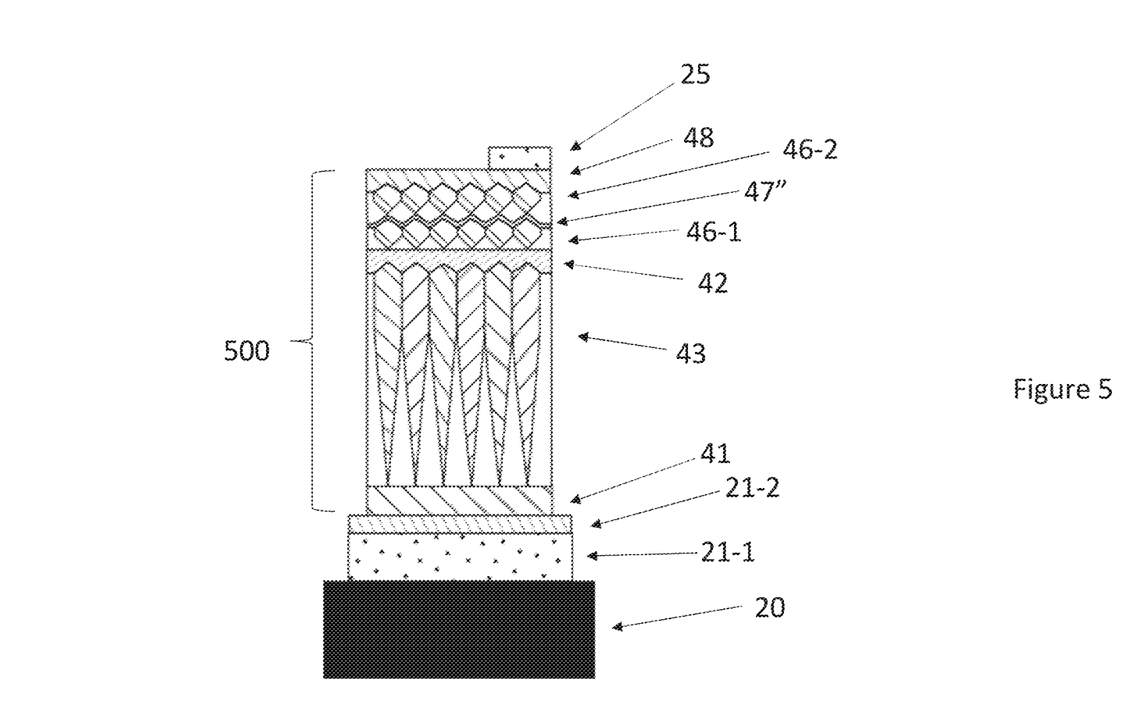
FIG. 5 is a schematic view of a stack for an SWIR detector according to a third embodiment of the present invention.

Turning now to FIG. 5, there is shown a still further embodiment of the stack 500. In this case, rather than a patterned metallic layer 47', a continuous metallic layer 47" is provided between the microcrystalline silicon layers 46-1, 46-2. The layer 47" is thin enough to be semi-transparent to SWIR wavelengths, but nonetheless provides a reflective surface within a resonant cavity. Thus, the layer 47" would typically have a thickness of between 10 nm and 100 nm.

A particular advantage of the above embodiments is that the internal photoemission generated at the interface of layers 46, 47 provides a relatively low noise signal.

Figure 6:
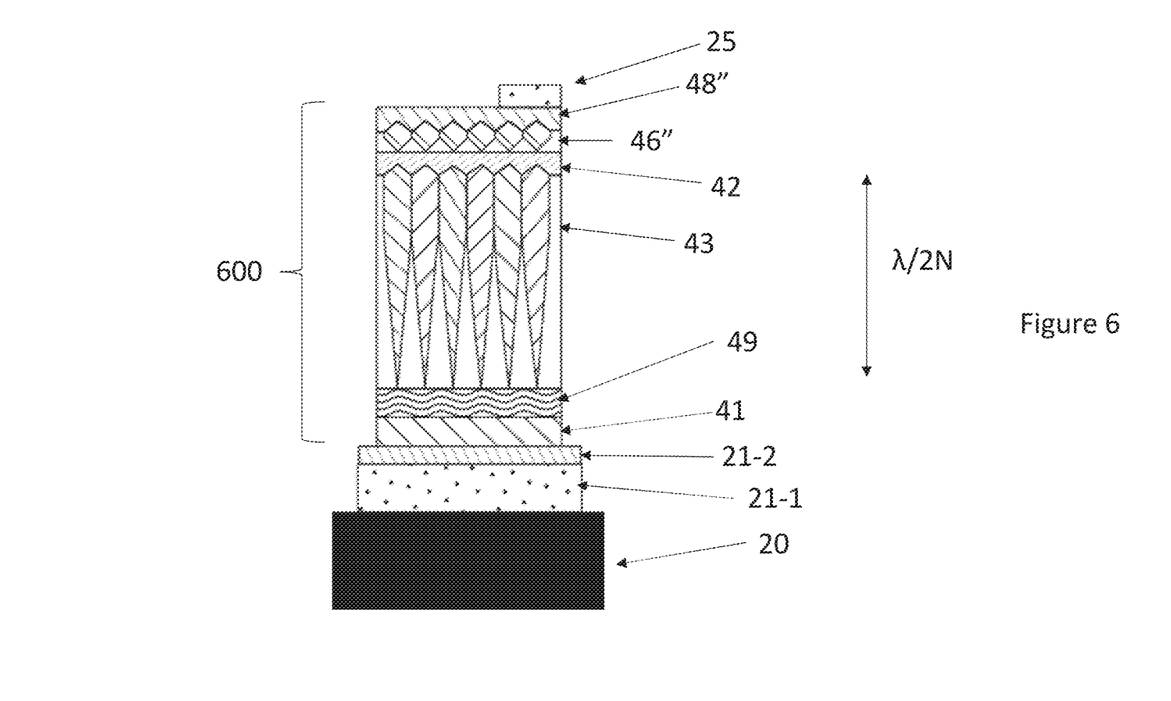
FIG. 6 is a schematic view of a stack for an SWIR detector according to a fourth embodiment of the present invention.

Referring now to FIG. 6, in a further embodiment, rather than using a metal-microcrystalline semiconductor interface to provide internal photoemission, a thin film micro-crystalline Germanium layer 49 is incorporated within a sensor stack 600 to absorb SWIR radiation.

It will be appreciated that materials other than microcrystalline Germanium can be employed, as long as they respond to incident SWIR radiation to generate carriers within the stack 400 through bulk absorption.

For example, it is possible to use quantum dots within an amorphous semiconductor material for the layer 49.

In the embodiment the layer 49 is shown immediately adjacent and between the layers 41 and 43, but this is not necessarily the case, especially if additional layers are employed within the stack.

In this embodiment, there is no Schottky junction as in the stacks 300-500 of FIGS. 3-5. Thus, a layer 48" of n-type microcrystalline Silicon is used for collecting carriers generated within the stack 600 as well as forming a quarter wavelength plate—an anti-reflective coating allowing SWIR radiation to penetrate the stack 600.

In the embodiment, the layer 48" is separated from the layer 42 by a further layer of microcrystalline silicon 46". Although not essential in this embodiment, as is also a second function of the layers 46 and 46-1, 46-2 of the embodiments of FIGS. 3-5, the microcrystalline silicon 46" provides a spacing between the gain stages at the interface of the layers 46"/42 and 42/43 and the biassing contact layer so tending to reduce noise.

It will also be noted that in this embodiment, there is no upper reflective metallic layer 47, 47', 47" as in the stacks 300-500 of FIGS. 3-5. Instead, in this embodiment, a change in refractive index at the interface of layers 42/43 generates reflections from light reflected by the layer 21-2. Thus, it is the thickness of the stack between the interface of layers 42/43 and the surface of the layer 21-2 which is matched to $\lambda/2N$.

Figure 7:
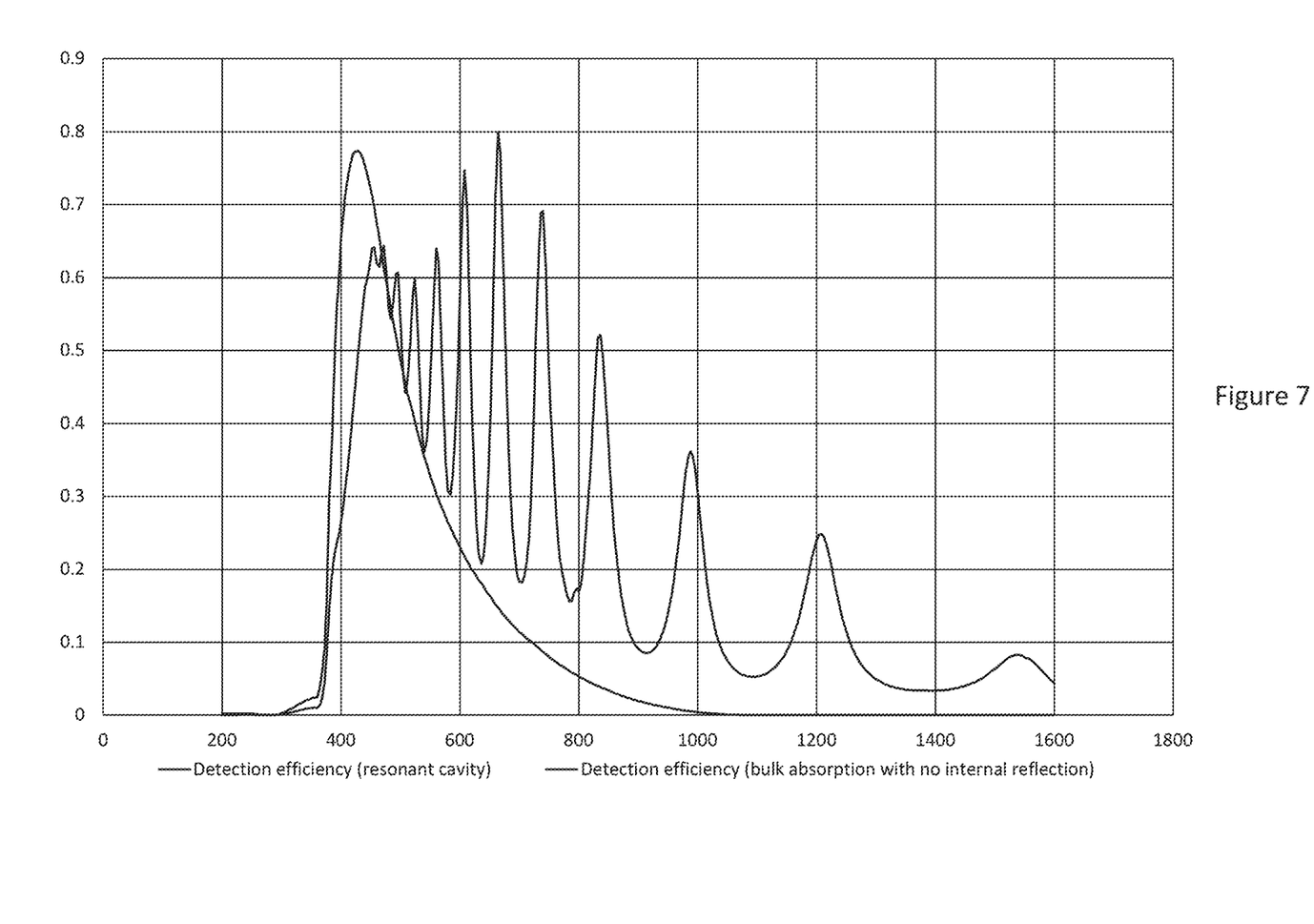
FIG. 7 illustrates the performance of the stack of FIG. 6 vis-à-vis stacks which do not involve a resonant cavity.

FIG. 7 compares the efficiency of the embodiment of FIG. 6 having a thickness which provides a resonant cavity and an approach relying on bulk absorption (by the Germanium) alone. As can be seen for stacks which do not employ a resonant cavity, for wavelengths above 1000 nm, the bulk absorption of material such as silicon is quite inefficient. On the other hand, even with normal band gap material such as silicon or a narrow bandgap material such as germanium, efficiencies of more than 30% can be achieved with a resonant cavity for wavelengths of 1000 nm and the detector is still responsive to wavelengths of greater than 1550 nm.

Figure 8:
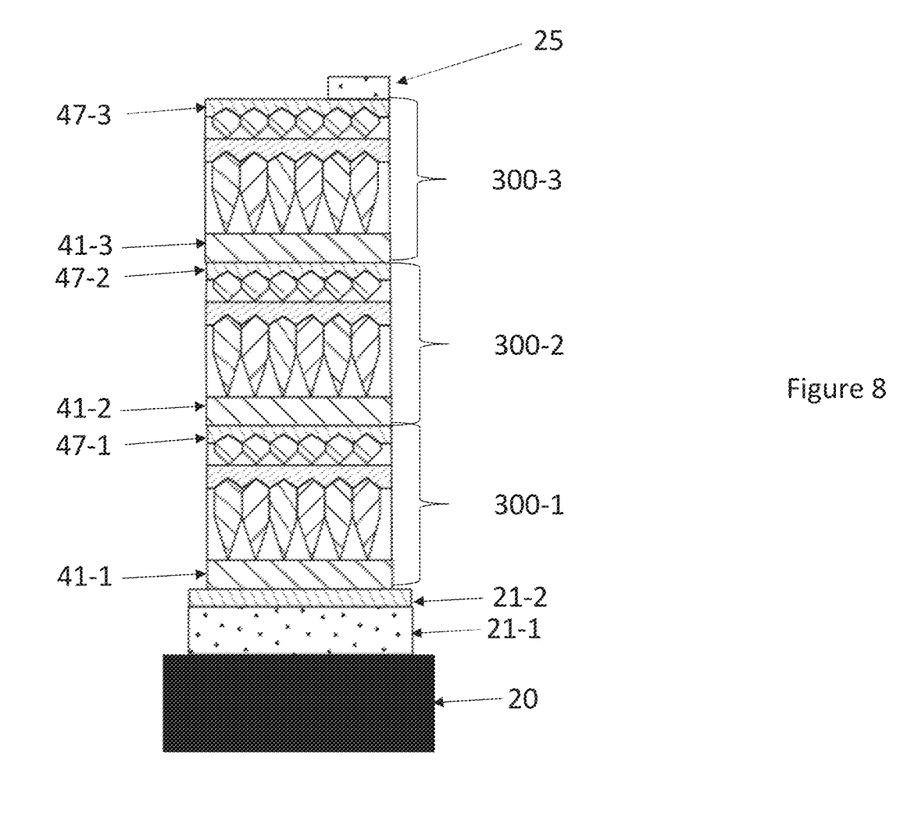
FIG. 8 is a schematic view of a multi-stack SWIR detector according to a fifth embodiment of the present invention.

Referring now to FIG. 8, there is shown an embodiment where multiple stacks, in this case, the stack 300 of FIG. 3 can be stacked on top of one another. Any light which is not absorbed by the top stack 300-3 may be absorbed and resonate within the stack 300-2 below and similarly, light not absorbed by the stack 300-2 may be absorbed and resonate within the stack 300-1 below to increase efficiency. In the example of FIG. 8, three stacks are shown, however, it will be appreciated that more or fewer stacks can be employed according to the efficiency of response which is required.

Clearly this principle is also applicable to each of the stacks of FIGS. 4-6.

The above-described embodiments have been concerned with a device for detecting SWIR wavelengths. It will be appreciated that this functionality can be deployed in a dedicated SWIR sensitive device or incorporated into a portion of a matrix area where the remaining portion of the matrix area comprises cells which are sensitive to non-SWIR wavelengths. So, for example, the matrix area can be divided into an array of super-cells where at least some super-cells comprise cells sensitive to SWIR wavelengths and constructed in accordance with the above-described embodiments and one or more cells which are sensitive to other wavelengths. Thus, the SWIR sensitive cells can be interspersed with non-SWIR sensitive cells.

One such application comprises hyperspectral imaging where the non-SWIR sensitive cells of a super cell may comprise conventional optical interference filters on top of CMOS sensor circuitry and can be selectively sensitive to wavelengths between visible and SWIR including any of R, G, B or NIR wavelengths. Indeed, such cells can be divided into more than one R, G, B or NIR sensitive cells as required for any specific hyperspectral imaging application. Alternatively, such non-SWIR sensitive cells could be sensitive to wavelengths such as orange/violet/yellow.

Alternatively, the stack structure described above for the SWIR sensitive cells could also be used for the non-SWIR sensitive cells so that similar processing can be employed across the entire matrix area, although needing to vary either layer thickness and/or material choice in accordance with the wavelength which any particular cell is to detect.

In a further alternative, the SWIR sensitive cells can be grouped together in one portion of the matrix area and non-SWIR sensitive cells can be fabricated in separate portion(s) of the matrix area. In such a case, the detector could comprise an imager array where each imager of the array has a corresponding optical or lens assembly (not shown).

One application of devices according to the present teaching is as components of LIDAR systems and in particular LIDAR systems employed for autonomous or semi-autonomous driving systems.

Those skilled in the art will recognize improvements and modifications to the preferred embodiments of the present disclosure. All such improvements and modifications are considered within the scope of the concepts disclosed herein and the claims that follow.

What is claimed is:

1. A short-wave infra-red, SWIR, radiation detection device comprising a plurality of layers extending over a substrate comprising at least a portion of a matrix area of a readout circuit formed using a CMOS fabrication process, said matrix area having a plurality of N rows divided into a plurality of M columns of cells, the radiation detection device comprising:
    a first metallic layer providing a first set of connections from said readout circuit to respective cells of said matrix area, said metallic layer reflecting SWIR wavelength radiation; and
    each cell of the SWIR detection device comprising at least one stack of layers, each stack including:
        a first layer of doped semiconductor material formed on said first metallic layer;
        an at least partially microcrystalline semiconductor layer formed over said first doped layer;
        a second layer of semiconductor material formed on said microcrystalline semiconductor layer;
        at least one microcrystalline semiconductor layer; and
        a second metallic layer interfacing said at least one microcrystalline semiconductor layer, said interface forming a Schottky junction responsive to incident SWIR radiation to generate carriers within said stack;
    said semiconductor material of each respective layer of said stack having a band gap less than approximately 1.1 eV; and said stack having a thickness $$T = \frac{\lambda}{2N}$$

between reflective surfaces of said first and second metallic layers, where
- λ is the wavelength of SWIR radiation to be sensed by the device, with λ>1 µm; and
- N is the refractive index of said stack material at said wavelength; and
- wherein said second metallic layer is formed between and interfaces with two microcrystalline semiconductor layers, said stack further comprising an uppermost layer of semiconductor material oppositely doped to said first layer.

2. The SWIR radiation detection device of claim 1 wherein said second metallic layer is either patterned or continuous.

3. The SWIR radiation detection device of claim 1 comprising a plurality of said stacks, said first layer of one stack between formed on an uppermost layer of a lower stack and an uppermost layer of one stack being formed below a first layer of an upper stack.

4. The SWIR radiation detection device of claim 1 wherein at least one of said layers of said stack is formed with a plasma enhanced-chemical vapor deposition (PECVD) process.

5. The SWIR radiation detection device of claim 1 further comprising a respective contact for each cell formed on an uppermost layer of an uppermost stack of said device.

6. The SWIR radiation detection device of claim 5 wherein contacts for pairs of adjacent cells are connected through respective bridges formed on said dielectric material and connecting through said dielectric material to said contacts.

7. The SWIR radiation detection device of claim 5 wherein said contacts are connected to a biasing signal.

8. The SWIR radiation detection device of claim 1 wherein cells are separated from one another with a dielectric material.

9. The SWIR radiation detection device of claim 1 wherein said second layer of semiconductor material comprises amorphous Silicon.

10. The SWIR radiation detection device of claim 1 wherein said semiconductor material comprises either: Silicon; Silicon Germanium; or Germanium.

11. The SWIR radiation detection device of claim 1 wherein said first metallic layer comprise a lower metallic layer connected to said readout circuit and an upper metallic layer formed on said lower metallic layer and which reflects SWIR radiation.

12. A detection device comprising the SWIR radiation detection device of claim 1 and wherein at least some of the remaining portion of the matrix area comprises cells which are sensitive to wavelengths other than SWIR.

13. A hyperspectral imaging device comprising the detection device of claim 12 wherein the cells of the remaining portion of the matrix area are selectively sensitive to wavelengths between visible and SWIR.

* * * * *